US012568776B2

(12) United States Patent
Solomon et al.

(10) Patent No.: US 12,568,776 B2
(45) Date of Patent: Mar. 3, 2026

(54) MULTIFILAMENT RESISTIVE MEMORY WITH INSULATION LAYERS

(71) Applicant: International Business Machines Corporation, Armonk, NY (US)

(72) Inventors: Paul Michael Solomon, Westchester, NY (US); Takashi Ando, Eastchester, NY (US); Eduard Albert Cartier, New York, NY (US); John Rozen, Hastings on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 666 days.

(21) Appl. No.: 17/941,574

(22) Filed: Sep. 9, 2022

(65) Prior Publication Data

US 2024/0090350 A1     Mar. 14, 2024

(51) Int. Cl.
| | |
|---|---|
| *H10N 70/20* | (2023.01) |
| *H10B 63/00* | (2023.01) |
| *H10N 70/00* | (2023.01) |

(52) U.S. Cl.
CPC ............. *H10N 70/24* (2023.02); *H10B 63/80* (2023.02); *H10N 70/026* (2023.02); *H10N 70/028* (2023.02); *H10N 70/063* (2023.02)

(58) Field of Classification Search
CPC ...... H10B 63/80; H10N 70/24; H10N 70/026; H10N 70/028; H10N 70/063; H10N 70/826; H10N 70/841; H10N 70/8833
See application file for complete search history.

(56) References Cited

U.S. PATENT DOCUMENTS

| | | | |
|---|---|---|---|
| 2012/0261638 A1 | 10/2012 | Sills et al. | |
| 2013/0094278 A1* | 4/2013 | Hou ........................ | H10B 63/20 |
| | | | 257/4 |
| 2014/0151621 A1* | 6/2014 | Tendulkar .......... | H10N 70/8833 |
| | | | 257/2 |
| 2014/0264224 A1 | 9/2014 | Zhang et al. | |
| 2014/0268995 A1 | 9/2014 | Joo et al. | |
| 2015/0155480 A1 | 6/2015 | Jo | |
| 2015/0187841 A1* | 7/2015 | Wang ................... | H10N 70/023 |
| | | | 257/2 |
| 2017/0207387 A1* | 7/2017 | Yang ...................... | H10N 70/24 |

(Continued)

FOREIGN PATENT DOCUMENTS

| | | |
|---|---|---|
| CN | 119856585 A | 4/2025 |
| WO | 2018182649 A1 | 10/2018 |
| WO | 2024/051746 A1 | 3/2024 |

OTHER PUBLICATIONS

International Search Report dated Nov. 14, 2023, received in a corresponding foreign application, namely International Application No. PCT/CN2023/117279, 7 pages.

(Continued)

*Primary Examiner* — Omar F Mojaddedi
(74) *Attorney, Agent, or Firm* — Scully, Scott, Murphy & Presser, P.C.; Yuanmin Cai

(57) ABSTRACT

A grain-boundary self-aligned resistive memory structure is provided enabling the closely-packed formation of multiple, oxide-based, ReRAM elements in parallel, each with its own compliance resistor. The structure is capable of forming multiple filaments, one per element, with the aim of reducing the variability in the composite ReRAM cell.

12 Claims, 2 Drawing Sheets

(56) References Cited

U.S. PATENT DOCUMENTS

| | | |
|---|---|---|
| 2017/0331034 A1 | 11/2017 | Lv et al. |
| 2019/0273205 A1 * | 9/2019 | Ando et al. |
| 2020/0136038 A1 * | 4/2020 | Manfrini ............... H10N 70/20 |
| 2021/0013408 A1 * | 1/2021 | Pai ........................ H10B 63/00 |
| 2021/0233812 A1 | 7/2021 | Reznicek et al. |
| 2022/0102630 A1 | 3/2022 | Rocklein et al. |

OTHER PUBLICATIONS

Hong, J., et al., "ALD Resist Formed by Vapor-Deposited Self-Assembled Monolayers", Langmuir, Published on Web Dec. 19, 2006, pp. 1160-1165, 23.

Xie, T., et al., "Synthesis of model AI-AI2O3 multilayer systems with monolayer oxide thickness control by circumventing native oxidation", Thin Solid Films, Aug. 11, 2020, 8 pages, 711.

Menzel, S. J.-M., "Modeling and Simulation of Resistive Switching Devices", Jun. 29, 2012, 156 pages.

* cited by examiner

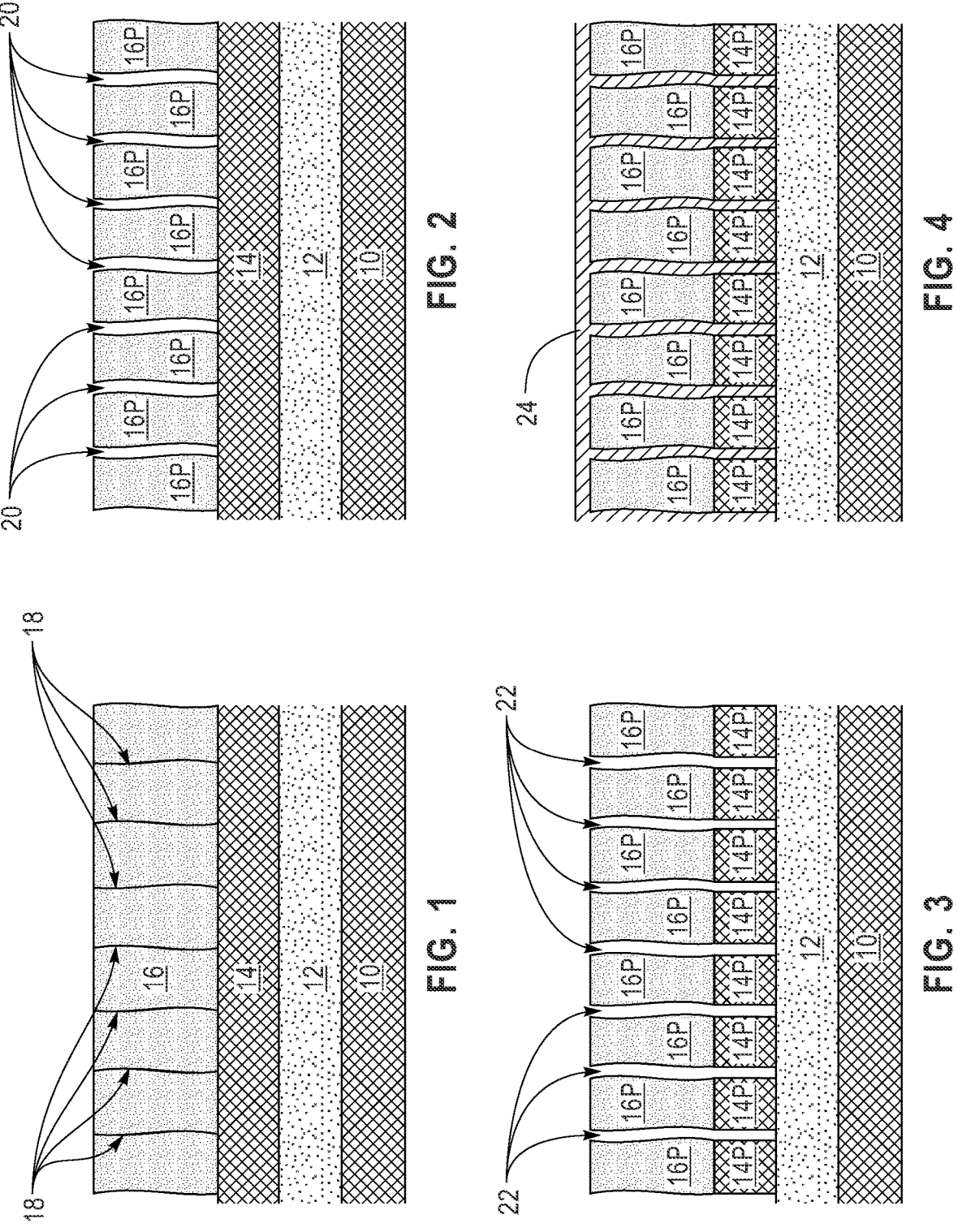

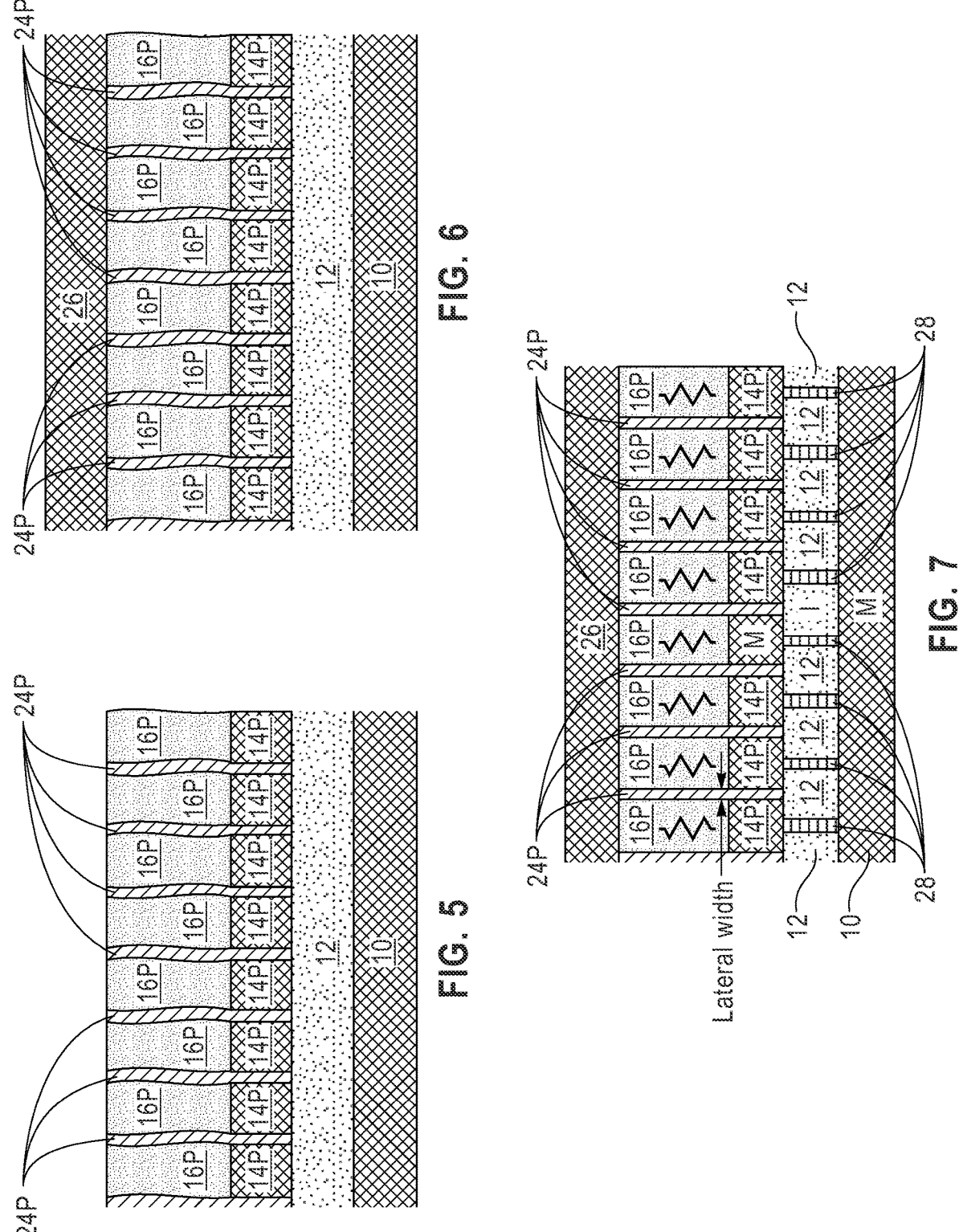

MULTIFILAMENT RESISTIVE MEMORY WITH INSULATION LAYERS

BACKGROUND

The present application relates to semiconductor technology, and more particularly to a non-volatile memory (NVM) structure and a method of forming the same.

Non-volatile memory (NVM) or non-volatile storage is a type of computer memory that can retain stored information even after the power is removed. In contrast, volatile memory needs constant power in order to retain data. NVMs, such as, for example, resistive random access memory (ReRAM), phase change random access memory (PCRAM), and conductive bridge random access memory (CBRAM), are getting renewed attentions for potential applications to neuromorphic computing with in-memory processing capability which reduces power consumption significantly and eliminates data busing time between memory and the central processing unit (CPU) of conventional complementary metal oxide semiconductor (CMOS) based neuromorphic computing.

CMOS compatible ReRAM elements based on partial oxide breakdown, forming reversible conductive filaments, is an attractive contender both for random access memory and for memory-in-logic applications such as for artificial synapses. Artificial resistive synapse arrays, in the form of analog resistive processing units (RPU), have been shown to have great potential to speed up the learning process in artificial neural networks (ANN) compared to all digital solutions. Resistors at each cross-point of the RPU array constitute the neuromorphic weight and should be capable of being programmed over a roughly linear range of conductance. Large arrays, needed for high processing throughput, require large values of resistance for the cross-points, of the order of megaohms. This is achieved by forming the filament with a large compliance resistor (or transistor) in series to limit the current during forming. This compliance resistor (usually a transistor) is placed as close to the ReRAM device as possible to minimize parasitic capacitance. The high resistance filament is very narrow involving very few oxygen vacancies in their formation leading to a large variability which makes them unsuitable for RPU applications.

SUMMARY

A grain-boundary self-aligned resistive memory structure is provided enabling the closely-packed formation of multiple, oxide-based, ReRAM elements in parallel, each with its own compliance resistor. The structure is capable of forming multiple filaments, one per element, with the aim of reducing the variability in the composite ReRAM cell.

In one aspect of the present application, a NVM structure is provided. In one embodiment, the NVM structure includes a filament forming layer located on a first metal layer. A plurality of pillar structures is located on the filament forming layer. Each pillar structure of the plurality of pillar structures includes a vertical stack of a second metal pillar and a resistive pillar. A dielectric isolation structure is located between each pillar structure of the plurality of pillar structures, and a third metal layer is located on top of the plurality of pillar structures.

In embodiments of the present application, the dielectric isolation structure has a lateral width from 0.5 nm to 5.0 nm. This lateral width which is substantially equal to the lateral width of columnar grain boundaries that were present in the original resistive layer that provided each resistive pillar, allows for tight spacing between the pillar structures which, in turn, permits the NVM structure to include tens to hundreds of these elements and still be substantially smaller than 1 $\mu m^2$.

In embodiments of the present application, the dielectric isolation structure has a bottommost surface that is in direct physical contact with the filament forming layer, and a topmost surface that is coplanar with a topmost surface of each of the pillar structures.

In embodiments of the present application, and during operational use which includes random access memory and memory-in-logic applications such as for artificial synapses, the NVM structure further includes at least one filament present in the filament forming layer. In such an embodiment, the at least one filament extends from a bottommost surface of the second metal pillar of one of the pillar structures to a topmost surface of the first metal layer.

In embodiments of the present application, the filament forming layer (sometimes referred to as a dielectric switching layer) is composed of a dielectric metal oxide having a dielectric constant of 4.0 or greater.

In embodiments of the present application, the first metal layer, the second metal pillar and the third metal layer are composed of an electrically conductive material, and the resistive pillar is composed of a resistive material having a higher resistivity than the electrically conductive material. In embodiments of the present application, the electrically conductive material is TiN and the resistive material is TiON.

In embodiments of the present application, the dielectric isolation structure is composed of a dielectric material having a dielectric constant of 4.0 or greater.

In another embodiment, the NVM structure includes a plurality of resistive random access memory (ReRAM) elements located between a first metal layer and a third metal layer, wherein each ReRAM element includes a filament forming layer, a filament located in the filament forming layer, and a pillar structure including a vertical stack of a second metal pillar and a resistive pillar, wherein each ReRAM element is connected in parallel to the first metal layer and the third metal layer.

In embodiments of the present application, the NVM structure further includes a dielectric isolation structure located between each pillar structure present in the plurality of ReRAM elements. In such embodiments, the dielectric isolation structure has a lateral width from 0.5 nm to 5.0 nm. Also, and in such an embodiment, the dielectric isolation structure has a bottommost surface that is in direct physical contact with the filament forming layer, and a topmost surface that is coplanar with a topmost surface of the pillar structure.

In another aspect of the present application, a method of forming a non-volatile memory (NVM) structure is provided. In one embodiment, the method includes forming a structure including a first metal layer, a filament forming layer located on the first metal layer, a second metal layer located on the filament forming layer, and a resistive layer located on the second metal layer, the resistive layer having columnar grain boundaries that extend from a bottommost surface to a topmost surface of the resistive layer. The columnar grain boundaries that are present in the resistive layer are first etched to provide a plurality of resistive pillars, wherein each resistive pillar is spaced apart from a neighboring resistive pillar by an opening. Next, the second metal layer is second etched utilizing each resistive pillar as an etch mask to provide an extended opening and a plurality of second metal pillars, wherein each second metal pillar is spaced apart from a neighboring second metal pillar by a lower portion of the extended opening. A dielectric isolation structure is then formed in the extended opening, and thereafter a third metal layer is formed on top of each resistive pillar.

In embodiments of the present application, the resistive layer having columnar grain boundaries is formed by physical vapor deposition. In some embodiments, an oxidation process is performed after the physical vapor deposition to increase the resistance of the resistive layer.

In embodiments of the present application, the forming the structure includes depositing an electrically conductive material on the filament forming layer, and oxidizing an upper portion of the electrically conductive material to provide the resistive layer, and wherein a lower portion of the electrically conductive material that is non-oxidized provides the second metal layer.

In embodiments of the present application, the first etch is a preferential etching process.

In embodiments of the present application, the second etch is an etch that is selective in removing the second metal layer relative to the resistive layer and the filament forming layer.

In embodiments of the present application, the forming of the dielectric isolation structure includes depositing a dielectric material having a dielectric constant of 4.0 or greater inside the extended opening and on top of each of the resistive pillars, and removing the dielectric material that is formed on top of each of the resistive pillars.

BRIEF DESCRIPTION OF THE DRAWINGS

FIG. 1 is a cross sectional view of an exemplary structure that can be employed in the present application, the exemplary structure including a first metal layer, a filament forming layer located on the first metal layer, a second metal layer located on the filament forming layer, and a resistive layer located on the second metal layer, the resistive layer having columnar grain boundaries that extend from a bottommost surface to a topmost surface of the resistive layer.

FIG. 2 is a cross sectional view of the exemplary structure of FIG. 1 after etching the columnar grain boundaries present in the resistive layer to provide a plurality of resistive pillars, wherein each resistive pillar is spaced apart from a neighboring resistive pillar by an opening.

FIG. 3 is a cross sectional view of the exemplary structure of FIG. 2 after etching the second metal layer utilizing each resistive pillar as an etch mask to provide an extended opening and a plurality of second metal pillars, wherein each second metal pillar is spaced apart from a neighboring second metal pillar by a lower portion of the extended opening.

FIG. 4 is a cross sectional view of the exemplary structure of FIG. 3 after filling the extended opening with a dielectric material.

FIG. 5 is a cross sectional view of the exemplary structure of FIG. 4 after removing the dielectric material from on top of each resistive pillar.

FIG. 6 is a cross sectional view of the exemplary structure of FIG. 5 after forming a third metal layer on top of each resistive pillar.

FIG. 7 is a cross sectional view of the exemplary structure shown in FIG. 6 during operational use thereof.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application resolves the high variability problem that is associated with prior art NVM containing ReRAM with discrete series resistance by creating a multiplicity of resistors each with a high value series resistors. This aspect of the present application as well as other will now be described in greater detail by referring to FIGS. 1-7. FIGS. 1-6 show the basic processing steps that can be used in forming the NVM structure of the present application, while FIG. 7 shows the NVM structure of the present application during operational use.

Notably, FIGS. 1-6 illustrate a self-aligned method for forming the NVM structure of the present application. The method of the present application will now be described by first referring to FIG. 1 which illustrates an exemplary structure that can be employed in the present application. The exemplary structure illustrated in FIG. 1 includes a first metal layer 10, a filament forming layer 12 located on the first metal layer 10, a second metal layer 14 located on the filament forming layer 12, and a resistive layer 16 located on the second metal layer 14. In accordance with the present application, the resistive layer 16 has columnar grain boundaries 18 that extend from a bottommost surface to a topmost surface of the resistive layer 16.

The first metal layer 10 can be composed of an electrically conductive material such as, for example, Ta, TaN, Ti, TiN, Ru, RuN, RuTa, RuTaN, Cu, Co, CoWP, CoN, W, WN or any combination thereof. The electrically conductive material that provides the first metal layer 10 is typically oxygen deficient. The first metal layer 10 can have a thickness from 2 nm to 80 nm; other thicknesses are possible and can be used in the present application as the thickness of first metal layer 10. The first metal layer 10 can be formed by a deposition process such as, for example, chemical vapor deposition (CVD), plasma enhanced chemical vapor deposition (PECVD), physical vapor deposition (PVD), atomic layer deposition (ALD), sputtering, electroplating or electroless plating. The first metal layer 10 is typically, but not necessary always, formed in the back-end-of-the-line (BEOL) region of a semiconductor structure. In some embodiments, the first metal layer 10 can be formed in the front-end-of-the-line (FEOL) region of a semiconductor structure, or in both the FEOL region and the BEOL region of a semiconductor structure.

The filament forming layer 12 (which can also be referred to herein as a dielectric switching layer) is composed of a dielectric material such as a dielectric metal oxide that has a dielectric constant of 4.0 or greater. All dielectric constants mentioned in the present application are measured in a vacuum unless otherwise stated. The filament forming layer 12 is electrically insulating at this point of the present application and during operational use, a filament which is electrically conducting can be formed in the filament forming layer 12. Examples of dielectric metal oxides that can be employed as the filament forming layer 12 include, but are not limited to, hafnium oxide, tantalum oxide, titanium oxide, aluminum oxide, silicon dioxide or combinations thereof. In some embodiments, hydrogen can be present in the dielectric material that provides the filament forming layer 12. The dielectric material that provides the filament forming layer 12 can be formed utilizing a deposition process such as, for example, CVD, PECVD, ALD, chemical solution deposition or evaporation. The filament forming layer 12 can have a thickness from 1 nm to 50 nm; other thicknesses however are contemplated can be used as the thickness of the filament forming layer 12.

The second metal layer 14 can include one of electrically conductive materials mentioned above for the first metal layer 10. In some embodiments, the electrically conductive material that provides the second metal layer 14 is compositionally the same as the electrically conductive material that provides the first metal layer 10. In one example, the electrically conductive material that provides both the first metal layer 10 and the second metal layer 14 is composed of TiN. In other embodiments, the electrically conductive material that provides the second metal layer 14 is compositionally different than the electrically conductive material that provides the first metal layer 10. In one example, the electrically conductive material that provides the first metal layer 10 is composed of TaN and the electrically conductive material that provides the second metal layer 14 is composed of TiN.

The second metal layer 14 can be formed utilizing one of the deposition processes mentioned above in forming the first metal layer 10. The second metal layer 14 can have a thickness within the thickness range mentioned above for the first metal layer 10.

The resistive layer 16 is composed of an electrically resistive material having a high resistivity (on the order of from $10^{-4}$ $\Omega$-cm to $10^{-2}$ $\Omega$-cm) such that it will substantially resist the flow of electrons as compared to the electrically conductive material mentioned above for the first metal layer 10 and the second metal layer 14. Examples of such resistive materials that can be used as the resistive layer 16 include, but are not limited to, TiON or AlC. The resistive layer 16 has columnar grain boundaries 18 that extend from a bottommost surface to a topmost surface of the resistive layer 16. As is known to those skilled in the art, a grain boundary is the interface between two grains, or crystallites, in a polycrystalline material. Grain boundaries are 2D defects in the crystal structure, and tend to decrease the electrical and thermal conductivity of the material. Columnar grain boundaries can refer to an arrangement of polycrystalline grains that span the entire thickness of the resistive layer in a vertical or a substantially vertical direction and appear as columns, such that the grain boundaries run from a bottommost to a topmost surface of a material and do not lie parallel to these surfaces.

The resistive layer 16 having the columnar grain boundaries 18 can be formed by PVD or any other deposition process which is capable of forming such a resistive layer 16. In some embodiments, an oxidation process can be performed after the deposition process, e.g., PVD, to increase the resistance of the resistive layer 16. In embodiments in which an oxidation process is performed, the oxidation process can be performed at a temperature from 250° C. to 500° C., with a temperature from 350° C. to 450° C. being more typical. The oxidation process is performed in an oxygen-containing ambient such as, for example, oxygen, ozone, and mixture with inert gas, such as Ar, He, and $N_2$. The duration of the oxidation process can vary depending on the type of resistive material that is formed and the thickness of the resistive layer 16.

In some embodiments, the second metal layer 14 and the resistive layer 16 are formed by first depositing an electrically conductive material, and then an oxidation process is performed to convert an upper portion of the electrically conductive material into a resistive material. In such an embodiment, the non-oxidized portion of the electrically conductive material serves as the second metal layer 14, while the oxidized portion of the electrically conductive material serves as the resistive layer 16. In one example, the electrically conductive material is composed of TiN, and the oxidized portion is composed of TiON.

The columnar grain boundaries 18 that are present in the resistive layer 18 have a lateral width from 0.1 nm to 3 nm, with a lateral width from 0.5 nm to 2 nm being more typical. Although having a relatively small lateral width, the columnar grain boundaries 18 can be etched preferentially as will be described in the next step of the present application.

Referring now to FIG. 2, there is illustrated the exemplary structure of FIG. 1 after etching the columnar grain boundaries 18 present in the resistive layer 16 to provide a plurality of resistive pillars 16P, wherein each resistive pillar 16P is spaced apart from a neighboring resistive pillar 16P by an opening 20. Each resistive pillar 16P has a thickness that is the same as the thickness of the resistive layer 16 mentioned above, and a lateral width of from 0.5 nm to 2.0 nm. Each opening 20 spans the entire thickness of the resistive layer 16 in a vertical or a substantially vertical direction. Furthermore, each opening 20 physically exposes a portion of a topmost surface of the second metal layer 14.

The etching of the columnar grain boundaries 18 is a preferential etch which selectively removes the columnar grain boundaries 18 of the resistive layer 16; some etching of the resistive material around the columnar grain boundaries 18 can occur thus the lateral width of the openings 20 can be slightly wider than the lateral width of the columnar grain boundaries 18. Each opening 20 that is formed has a lateral width from 0.5 nm to 5.0 nm, with a lateral width from 0.5 nm to 2 nm being more typical. In some embodiments, the preferential etching of the columnar grain boundaries 18 includes diluted $H_2O_2$, and SC1.

Referring now to FIG. 3, there is illustrated the exemplary structure of FIG. 2 after etching the second metal layer 14 utilizing each resistive pillar 16P as an etch mask to provide an extended opening 22 and a plurality of second metal pillars 14P, wherein each second metal pillar 14P is spaced apart from a neighboring second metal pillar 14P by a lower portion of the extended opening 22. Each of the extended openings 22 has substantially a same lateral width (within±10%) as the openings 20.

Each second metal pillar 14P has a thickness that is the same as the thickness of the second metal layer 14 mentioned above, and a lateral width of from 0.5 nm to 2.0 nm. Each extended opening 22 includes an upper portion composed of opening 20 and a lower portion that extends completely through the second metal layer 14 such that a portion of a topmost surface of the filament forming layer 12 is physically exposed.

Each second metal pillar 14P is located beneath one of the resistive pillars 16P. A plurality of pillar structures is thus formed on top of the filament forming layer 12. Each pillar structure is composed of a vertical stack of one of the second metal pillars 14P and one of the resistive pillars 16P.

The etching of the second metal layer 14 which occurs through each of the openings 20 and utilizes each second metal pillar 16P as an etch mask includes an etching process that is selective in removing the electrically conductive material that provides the second metal layer 14 relative to either the resistive material that provides resistive layer 16 and the filament forming layer 12. In some embodiments, the etching process includes a dry etching process such as, for example, reactive ion etching (RIE), ion beam etching (IBE) or plasma etching. In other embodiments, the etching includes a chemical wet etching process such as, for example, diluted $H_2O_2$, and SC1.

Referring now to FIG. 4, there is illustrated the exemplary structure of FIG. 3 after filling the extended opening 22 with a dielectric material 24. As is shown in FIG. 4, a portion of the dielectric material 24 is also formed on top of each of the resistive pillars 16P. The dielectric material 24 includes an electrical insulating material such as one having a dielectric constant that is 4.0 or greater (i.e., a high-k dielectric material). The dielectric material 24 is typically compositionally different from the filament forming layer 12. Illustrative examples of high-k dielectric materials that can be used as dielectric material 24 include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SfTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb(Sc,Ta)$O_3$), or lead zinc niobite (Pb(Zn,Nb)O).

The dielectric material 24 can be formed utilizing a deposition process such as, for example, ALD, CVD, PECVD, or PVD. The dielectric material 24 is typically a conformal layer meaning that the dielectric material 24 has a thickness along a vertical surface of another material that is substantially the same (i.e., within±10%) of its' thickness along a horizontal surface of the another material.

Referring now to FIG. 5, there is illustrated the exemplary structure of FIG. 4 after removing the dielectric material 24 from on top of each resistive pillar 16P. The removal of the dielectric material 24 from on top of the resistive pillars 16P includes a planarization process such as, for example, chemical mechanical polishing (CMP) or grinding. Dielectric material 24 remains in each of the extended openings 22 after the planarization process. This remaining dielectric material 24 can be referred to as a dielectric isolation structure 24P.

As is shown in FIG. 5, each dielectric isolation structure 24P has a bottommost surface that is in direct physical contract with a topmost surface of the filament forming layer 12 and a topmost surface that is coplanar with a topmost surface of each of the resistive pillars 16P. Each dielectric isolation structure 24P separates one pillar structure including a vertical stack of one of the second metal pillars 14P and one of the resistive pillars 16P from its neighboring pillar structure which also includes a vertical stack of another one of the second metal pillars 14P and another one of the resistive pillars 16P. Each dielectric isolation structure 24P has a laterally width that is the same as the lateral width of the extended openings 22. See, FIG. 7, which identifies the lateral width of the dielectric isolation structures 24.

Referring now to FIG. 6, there is illustrated the exemplary structure of FIG. 5 after forming a third metal layer 26 on top of each resistive pillar 16P; the third metal layer 26 also is formed on top of each dielectric isolation structure 24P. The third metal layer 26 can include one of electrically conductive materials mentioned above for the first metal layer 10. In some embodiments, the electrically conductive material that provides the third metal layer 26 is compositionally the same as the electrically conductive material that provides the first metal layer 10 and/or the second metal layer 14. In one example, the electrically conductive material that provides each of the first metal layer 14, the second metal layer 14 and the third metal layer 26 is composed of TiN. In other embodiments, the electrically conductive material that provides the second metal layer 14 is compositionally different than the electrically conductive material that provides the first metal layer 10 and/or second metal layer 14. In one example, the electrically conductive material that provides the first metal layer 14 is composed of TaN and the electrically conductive material that provides the second metal layer 14 and the third metal layer is composed of TiN. In yet another example, the electrically conductive material that provides the first metal layer 14 is composed of TaN, the electrically conductive material that provides the second metal layer 14 is composed of TiN, and the electrically conductive material that provides the third material layer 26 is composed of WN.

The third metal layer 26 can be formed utilizing one of the deposition processes mentioned above in forming the first metal layer 10. The third metal layer 26 can have a thickness within the thickness range mentioned above for the first metal layer 10.

FIG. 6 illustrates an exemplary NVM structure in accordance with the present application. The NVM structure includes filament forming layer 12 located on first metal layer 10. A plurality of pillar structures is located on the filament forming layer 12. Each pillar structure of the plurality of pillar structures includes a vertical stack of a second metal pillar 14P and a resistive pillar 16P. A dielectric isolation structure 24P is located between each pillar structure of the plurality of pillar structures, and third metal layer 26 is located on top of the plurality of pillar structures.

Referring now to FIG. 7, there is illustrated the exemplary structure shown in FIG. 6 during operational use thereof. FIG. 7 includes the elements "M" and "I" which denotes metal and insulator, respectively. Notably, FIG. 7 illustrates an exemplary NVM structure of the present application that includes multiple isolated series resistors (i.e., the resistive pillars 16P) that are capable of forming multiple filaments 28 in the filament forming layer 12. The filaments 28 extend from a bottommost surface of a second metal pillar 14P to a topmost surface of the first metal layer 10. Although multiple filaments 28 are illustrated as being formed, the present application contemplates embodiments in which a single filament 28 is formed. The filaments 28 are formed by applying an electrical bias between the first 10 and the third 26 metal layers.

The structure illustrated in FIG. 7 has advantages over a prior art NVM structure including a single resistor since the number of filaments 28 is now variable and the individual filaments 28 can be of fairly low resistance, hence small variability while the resistance of the combination can be varied by programming the filaments 28 into high or low resistance states. While this process is stochastic, it still involves much larger numbers of channels than the single resistor case, so it has the potential to reduce variations.

The NVM structure illustrated in FIG. 7 includes multiple isolated ReRAM elements (the ReRAM elements include filament forming layer 12, filament 28, and one of the pillar structures 14P/16P) in parallel with each other and each ReRAM element contains an isolated compliance resistor (i.e., resistive pillar 16P). In the present application, the filament 28 of each ReRAM element is in direct physical contact with the first metal layer 10 and the resistive pillar 16P is in direct physical contact with the third metal layer 26.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A non-volatile memory (NVM) structure comprising:
a filament forming layer located on a first metal layer;
a plurality of pillar structures located on, and in direct physical contact with, the filament forming layer, wherein each pillar structure of the plurality of pillar structures includes a vertical stack of a second metal pillar and a resistive pillar;
a dielectric isolation structure located between each pillar structure of the plurality of pillar structures, wherein the dielectric isolation structure has a topmost surface that is coplanar with a topmost surface of each of the pillar structures; and
a third metal layer located on top of, and in direct physical contact with, the plurality of pillar structures.

2. The NVM structure of claim 1, wherein the dielectric isolation structure has a lateral width from 0.5 nm to 5.0 nm.

3. The NVM structure of claim 1, wherein the dielectric isolation structure has a bottommost surface that is in direct physical contact with the filament forming layer.

4. The NVM structure of claim 1, further comprising at least one filament present in the filament forming layer.

5. The NVM structure of claim 4, wherein the at least one filament extends from a bottommost surface of the second metal pillar of one of the pillar structures to a topmost surface of the first metal layer.

6. The NVM structure of claim 1, wherein the filament forming layer is composed of a dielectric metal oxide having a dielectric constant of 4.0 or greater.

7. The NVM structure of claim 1, wherein the first metal layer, the second metal pillar and the third metal layer are composed of an electrically conductive material, and the resistive pillar is composed of a resistive material having a higher resistivity that the electrically conductive material.

8. The NVM structure of claim 7, wherein the electrically conductive material is TiN and the resistive material is TiON.

9. The NVM structure of claim 1, wherein the dielectric isolation structure is composed of a dielectric material having a dielectric constant of 4.0 or greater.

10. A non-volatile memory (NVM) structure comprising:
a plurality of resistive random access memory (ReRAM) elements located between a first metal layer and a third metal layer, wherein each ReRAM element comprises a filament forming layer, a filament located in the filament forming layer, and a pillar structure comprising a vertical stack of a second metal pillar and a resistive pillar, wherein the pillar structure is located on, and is in direct physical contact with, the filament forming layer, and the resistive pillar is in direct physical contact with the third metal layer, and each ReRAM element is connected in parallel to the first metal layer and the third metal layer; and
a dielectric isolation structure located laterally adjacent to the pillar structure, wherein the dielectric isolation structure has a topmost surface that is coplanar with a topmost surface of the pillar structure.

11. The NVM structure of claim 10, wherein the dielectric isolation structure has a lateral width from 0.5 nm to 5.0 nm.

12. The NVM structure of claim 10, wherein the dielectric isolation structure has a bottommost surface that is in direct physical contact with the filament forming layer.

* * * * *